(12) United States Patent
Jeong

(10) Patent No.: US 6,642,803 B2
(45) Date of Patent: Nov. 4, 2003

(54) TEMPERATURE COMPENSATED CRYSTAL OSCILLATOR

(75) Inventor: Chan Yong Jeong, Seoul (KR)

(73) Assignee: Samsung Electro-Mechanics Co., Ltd., Kyungki-do (KR)

(*) Notice: Subject to any disclaimer, the term of this patent is extended or adjusted under 35 U.S.C. 154(b) by 0 days.

(21) Appl. No.: 10/083,406

(22) Filed: Feb. 27, 2002

(65) Prior Publication Data

US 2003/0102930 A1 Jun. 5, 2003

(30) Foreign Application Priority Data

Dec. 4, 2001 (KR) ........................................ 2001-76124

(51) Int. Cl.[7] ................................................ H03B 1/00
(52) U.S. Cl. ............................ 331/70; 331/68; 331/176; 310/346
(58) Field of Search ................................ 331/176, 175, 331/67, 68, 69, 70, 62, 187; 310/340–348; 361/728, 753, 720

(56) References Cited

U.S. PATENT DOCUMENTS 4,750,246 A * 6/1988 Pollard ........................ 29/25.35
5,422,615 A * 6/1995 Shibagaki et al. .......... 333/246
5,796,165 A * 8/1998 Yoshikawa et al. ......... 257/728
6,229,404 B1 * 5/2001 Hatanaka ...................... 331/68

OTHER PUBLICATIONS

Abstract Application No. JP19930034316 19930129, Publication Date Aug. 19, 1994.
Abstract Application No. JP19970368364 19971229, Publication Date Jul. 21, 1999.

* cited by examiner

Primary Examiner—Minh Nguyen
(74) Attorney, Agent, or Firm—Lowe Hauptman Gilman & Berner LLP

(57) ABSTRACT

A temperature compensated crystal oscillator has first and second layered structures, an IC chip, a crystal vibrating chip, a resin mold portion and a metal cover. Each of the first and second layered structures has a cavity formed therein. The cavity formed in the second layered structure does not overlap with the cavity of the first layered structure. The IC chip is inserted into the cavity of the first layered structure. The crystal vibrating chip is inserted into the cavity of the second layered structure. The resin mold portion is formed by charging resin into the cavity of the first layered structure. The metal cover is arranged on the upper surface of the second layered structure for covering an opening of the cavity of the second layered structure.

12 Claims, 5 Drawing Sheets

US 6,642,803 B2

TEMPERATURE COMPENSATED CRYSTAL OSCILLATOR

BACKGROUND OF THE INVENTION

1. Field of the Invention

The present invention relates generally to temperature compensated crystal oscillators, and more particularly to a miniaturized temperature compensated crystal oscillator, in which two cavities forming mounting structures for a crystal vibrating chip and an IC chip are arranged not to be vertically overlapped, thus allowing a separating layer between the two cavities to be removed.

2. Description of the Prior Art

Generally, crystal oscillators using crystal vibrating chips are essential parts to generate oscillation frequencies for controlling transmission and reception of signals between mobile communication terminals. The crystal oscillators have excellent frequency stability compared with other oscillators. However, the crystal vibrating chips are problematic in that their oscillation frequencies are varied due to ambient temperature, In order to solve the problem, the crystal oscillators have additional parts for compensating the frequency variation due to the temperature sensitivity of the crystal vibrating chips. Such oscillators are each so-called temperature compensated crystal oscillator (TCXO). The temperature compensated crystal oscillators are classified into two types according to the realization method of a temperature compensation circuit; one-chip type using an integrated circuit (IC) chip and a discrete type in which various parts such as a piezoelectric oscillating element, an integrated circuit, capacitors, inductors and resistors, are mounted. Hereinafter, various structures of temperature compensated crystal oscillators proposed in the prior art are described.

FIGS. 1a and 1b are a side sectional view and a plane view of a conventional discrete type TCXO 10, respectively. As shown in FIGS. 1a and 1b, the discrete type TCXO 10 has a structure in which a crystal oscillating unit 13 containing a crystal vibrating chip is arranged on the upper surface of a printed circuit layer (PCB) 11, and a plurality of parts 15 for a temperature compensation circuit are arranged at both side portions of the crystal oscillating unit 13 The term "crystal oscillating unit" represents a surface mounted device type part constructed by packaging the crystal vibrating chip. The temperature compensation parts 15 generally occupy an area approximately 2 to 3 times as large as the crystal oscillating unit 13 with a size of 5.0×3.2 mm$^2$ or 4.7×2.9 mm$^2$. Further, the printed circuit board 11 used in the TCXO 10 requires an area much larger than the crystal oscillating unit 13, such that a final product installed with the crystal oscillating unit 13 is also increased in its size (for example, larger than 7.0×5.2 mm$^2$).

As described above, the difficulty in the miniaturization of discrete type TCXO restricts the employment of the TCXO as parts of mobile communication terminals. On the other hand, the one-chip type TCXO is advantageous in that the final product can be miniaturized by the use of an IC chip in which a plurality of parts such as a temperature compensation circuit and etc. are integrated, although its phase noise characteristics are somewhat bad in comparison with the discrete type TCXO. As a result, one-chip type TCXO is widely used recently.

FIGS. 2a and 2b are side sectional views of two different conventional one-chip type TCXOs. Referring to FIGS. 2a and 2b, one-chip type TCXOs 20 or 20' are comprised of a layered structure 21 or 21' having an IC chip 27 or 27' in which a plurality of parts are integrated.

Especially, the temperature compensated crystal oscillator (TCXO) 20 of FIG. 2a is comprised of the layered structure 21 in which first to fourth layers 21a to 21d are stacked in turn and different cavities are formed in the third and fourth layers 21c and 21d, respectively. The layered structure 21 includes the IC chip 27 inserted into the cavity formed in the third layer 21c, wherein the IC chip 27 is bonded to connection pads 28 on the second layer 21b. Further, a crystal vibrating chip 23a is inserted into the cavity, which is formed in the fourth layer 21d and has an opening larger than the cavity of the third layer 21c. Finally, a metal cover 25 is mounted on the upper surface of the fourth layer 21d.

The one-chip type TCXO 20 shown in FIG. 2a is advantageous in the miniaturization aspect. However, if the crystal vibrating chip 23a is damaged in the mounting process, the IC chip 27 must be also discarded due to the difficulty in the separation of the crystal vibrating chip 23a. That is, when the crystal vibrating chip 23a is inserted after the IC chip 27, most of the damage may occur in the process of inserting the crystal vibrating chip 23a. However, according to the process due to the structure, the crystal vibrating chip 23a is arranged after the IC chip 27 is mounted. Accordingly, even if damage of the crystal vibrating chip 23a is detected, it is difficult to reuse the already mounted IC chip 27 which is comparatively expensive, Therefore, this structure of FIG. 2a unnecessarily increases costs in the process for producing high quality products. Further, this structure is problematic in that the performance of the TCXO 20 is decreased due to mutual electromagnetic interference, because the TCXO 20 does not have shielding means such as a layer for blocking electrical influence between the crystal vibrating chip 23a and the IC chip 27, and so both of them directly influence each other.

In order to solve the problems, the surface mounted device-type crystal oscillator 20' of FIG. 2b is proposed, wherein a crystal oscillating unit 23' is mounted on top. As already explained in FIG. 1a, the term "crystal oscillating unit" represents a surface mounted device type part constructed by packaging the crystal vibrating chip. The TCXO 20' is constructed such that a cavity is formed in a layer 21c', and an IC chip 27' is mounted on connection pads 28' formed on the upper surface of a layer 21b' which forms the lower surface of the cavity using a flip chip bonding method, and finally the crystal oscillating unit 23' is mounted on the upper surface of the top layer 21c', In the surface mounted device-type crystal oscillator 20', because the crystal vibrating chip is contained inside the crystal oscillating unit 23', the damage occurring in the inserting process of the crystal vibrating chip can be prevented, and further electromagnetic interference between the IC chip 27' and the crystal oscillator 23' can be effectively shielded by the package surrounding the crystal vibrating chip, thus maintaining the performance of good quality of the TCXO 20'.

In order to basically solve the problems occurring in the TCXO 20 of FIG. 2a compared with the crystal oscillator of FIG. 2b, another structure of a temperature compensated crystal oscillator 30 of FIG. 3 is proposed. Referring to FIG. 3, the temperature compensated crystal oscillator 30 has a TCXO structure in which an additional cavity is formed in a lower layer 31b to insert an IC chip 37 into the cavity. Referring to FIGS. 3a and 3b, the TCXO 30 is comprised of upper layer regions 31d and 31e in which a cavity for mounting a crystal vibrating chip 33 is formed, and lower layer regions 31a and 31b in which a cavity for mounting the IC chip 37 is formed. In this case, the two cavities are separated by an additional layer 31c. Here, the upper layer regions 31d and 3e are elements corresponding to the surface mounted device-type crystal oscillating unit 23' shown in FIG. 2b.

According to the TCXO 30, the mounting space of the IC chip 37 is separated from that of the crystal vibrating chip 33 by the layer 31c arranged between the two cavities, such that additional mounting spaces for the IC chip 37 and the crystal vibrating chip 33 can be prepared. Therefore, the problems of the crystal oscillator of FIG. 2a can be basically solved by varying the layer structure, contrary to the crystal oscillator of FIG. 2b. In other words, the mounting spaces for the crystal vibrating chip 33 and the IC chip 37 are vertically separated from each other. Accordingly, even if the crystal vibrating chip 33 is damaged in the inserting process, there is no need to discard the IC chip 37. Further, because the crystal vibrating chip 33 and the IC chip 37 are separated by the layer 31c, mutual electromagnetic interference therebetween can be effectively blocked.

However, the temperature compensated crystal oscillator having the above structure is problematic in that it is difficult to mount the crystal oscillator to mobile communication terminals due to its increased height. Further, as slim mobile communication terminals have been popularized recently, it is gradually required to miniaturize the terminals through the reduction of their heights rather than their areas. Accordingly, in this technical field, a new TCXO structure for realizing the miniaturization through the reduction of height of each mobile communication terminal is required, while maintaining the advantages of the TCXO structure of FIG. 3 suitable for production of good products.

SUMMARY OF THE INVENTION

Accordingly, the present invention has been made keeping in mind the above problems occurring in the prior art, and an object of the present invention is to provide a temperature compensated crystal oscillator, in which two cavities for accommodating a crystal vibrating chip and an IC chip are each opened at its top and bottom, and arranged not to be vertically overlapped so as to remove a layer for separating the crystal vibrating chip and the IC chip, thereby reducing the height of a final product.

In order to accomplish the above object, the present invention provides a temperature compensated crystal oscillator, comprising a first layered structure comprised of at least one layer and provided with a cavity formed therein; a second layered structure arranged on the upper surface of the first layered structure, comprised of at least one layer, and provided with a cavity formed in a region not overlapped with the cavity of the first layered structure; an IC chip inserted into the cavity of the first layered structure; a crystal vibrating chip inserted into the cavity of the second layered structure; a resin mold portion formed by charging resin into the cavity of the first layered structure accommodating the IC chip to make its bottom surface level with the bottom surface of the first layered structure; and a metal cover arranged on the upper surface of the second layered structure for covering the cavity formed of the second layered structure.

According to a preferred embodiment, the first layered structure can be comprised of a plurality of layers, wherein an integrated cavity can be formed through the layers. Through this structure, the cavity having a sufficient height for mounting the IC chip can be formed, even though thin layers are used.

Moreover, it is preferable to provide a portion of the lower surface of the second layered structure as the upper surface of the cavity formed in the first layer structure, arrange conduction pads for flip chip bonding in the portion, and insert the IC chip into the cavity formed in the first layered structure, such that the IC chip is connected to the conduction pads using a flip chip bonding manner, In the preferred embodiment of the present invention, the second layered structure is comprised of a first layer and second layer placed on the upper surface of the first layer. In this case, a cavity formed in the second layer has an opening larger than at least the crystal vibrating chip, and a cavity formed in the first layer has an opening smaller than at least the crystal vibrating chip, such that the cavities formed in the first and second layers can be formed as an integrated cavity having a stepped structure.

At this time, the crystal vibrating chip is arranged such that its one end is connected to the upper portion of a side wall of the cavity formed in the first layer, and its other end is contacted with the upper portion of an opposite side wall, such that the crystal vibrating chip can oscillate by receiving signals through a signal path formed at the upper portion of the side wall connected to its one end.

In another preferred embodiment of this invention, the first layered structure has a connection bump made of a conductor on its upper surface provided as the lower surface of the cavity formed in the second layered structure, and the crystal vibrating chip is inserted into the cavity formed in the second layered structure, such that crystal vibrating chip can oscillate by receiving signals through the connection bump and the signal path, with the crystal vibrating chip being fixed to the connection bump.

Moreover, the cavities formed in the first and second layered structures can be each constructed in the shape of a rectangle according to the shapes of IC chip and the crystal vibrating chip to be respectively inserted into the cavities.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The term "layered structure" among terms used in this specification is defined as a structure comprised of at least one layer, that is, one layer or a plurality of layers.

Figure 4A:
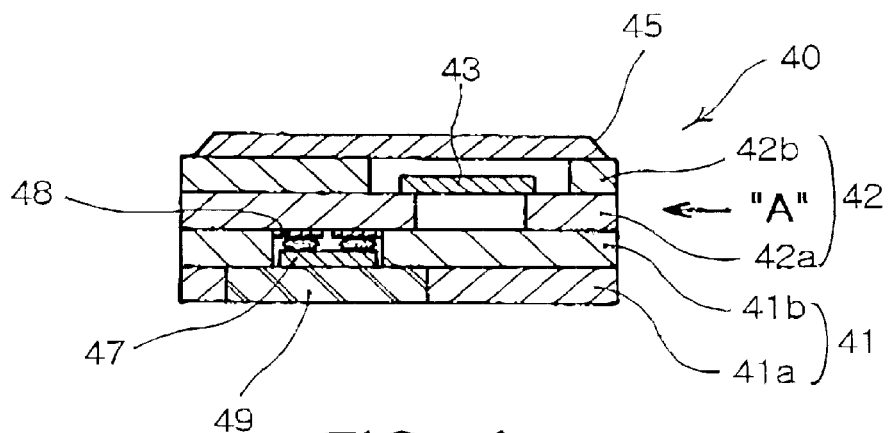
FIGS. 4a to 4c are respectively a front side sectional view, a plane view and a left side sectional view of a TCXO according to a preferred embodiment of the present invention.
Figure 4B:
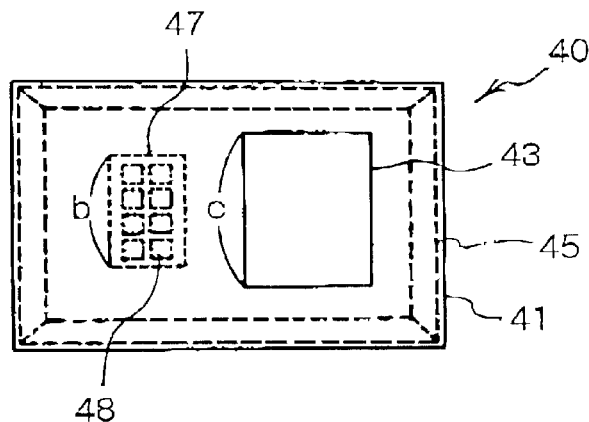
Figure 4C:
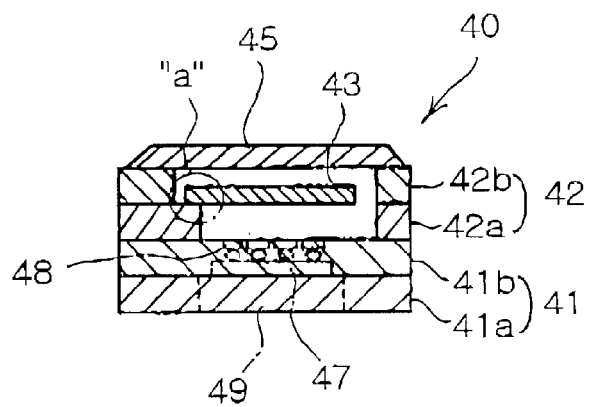

FIGS. 4a to 4c schematically show the structure of a temperature compensated crystal oscillator (TCXO) 40 according to a preferred embodiment of this invention. FIG. 4a is a side sectional view of the temperature compensated crystal oscillator 40 in a front direction, FIG. 4b is a plane view of the crystal oscillator 40, and FIG. 4c is a right side sectional view of the crystal oscillator 40 in a direction of A.

Referring to FIG. 4a, the temperature compensated crystal oscillator 40 comprises first and second layered structures 41 and 42 in which cavities each having openings at their tops and bottoms are respectively formed. The first layered structure 41 is comprised of two layers 41a and 41b, and the second layered structure 42 comprised of two other layers 42a and 42b is formed on the upper surface of the first layered structure 41. In the second layered structure 42, a cavity is formed in a region which is not overlapped in a layered direction, that is, in the vertical direction, with the region of the cavity of the first layered structure 41.

Figure 1A:
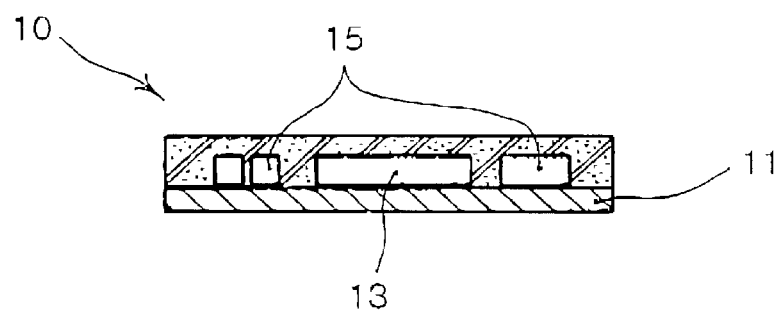
FIGS. 1a and 1b are respectively a side sectional view and a plane view of a conventional discrete type TCXO.
Figure 1B:
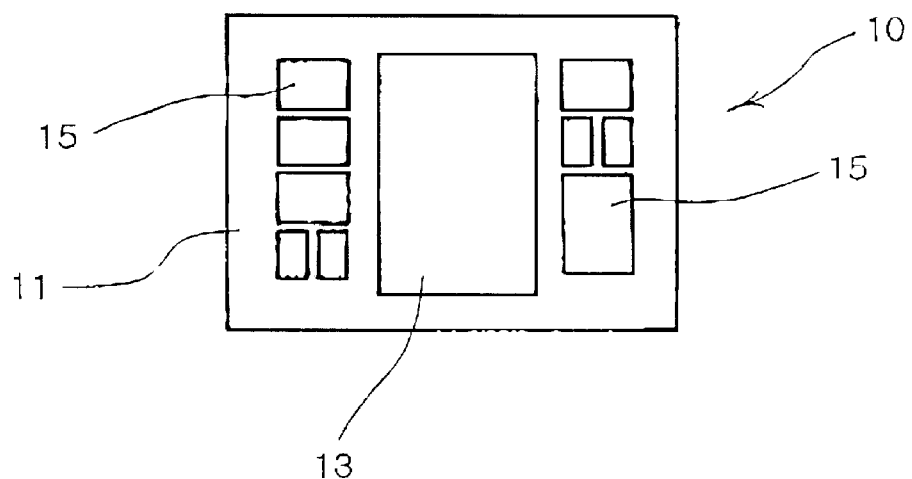
Figure 2A:
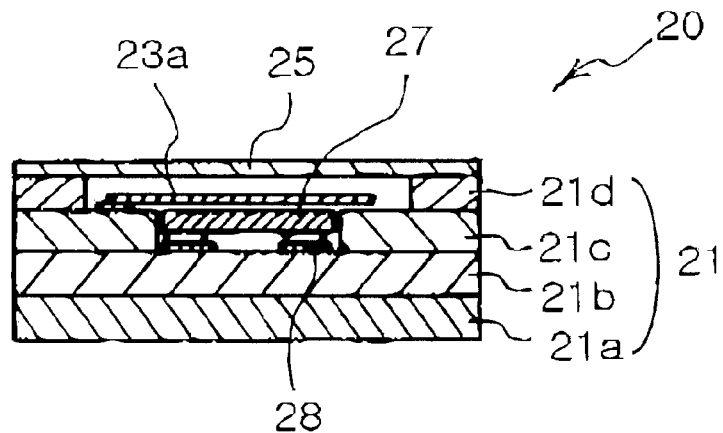
FIGS. 2a and 2b are side sectional views of two examples of a conventional one-chip type TCXO.
Figure 2B:
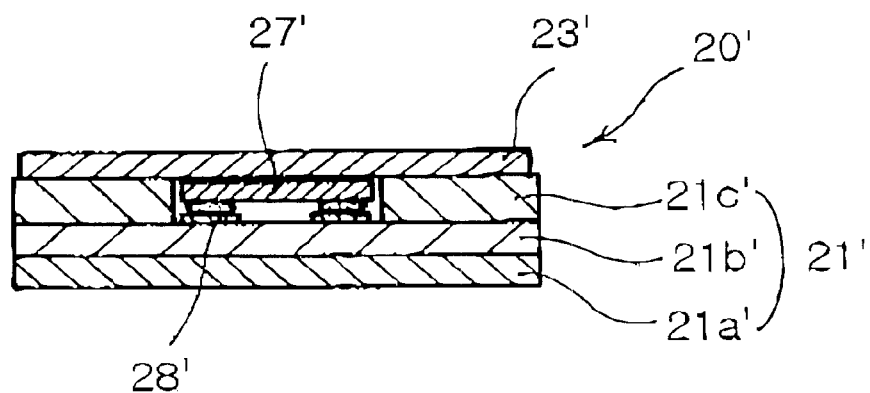
Figure 3A:
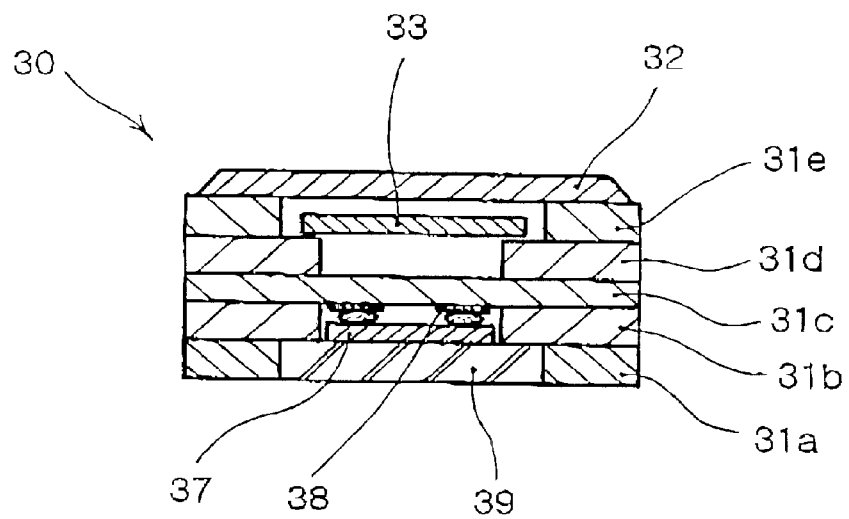
FIGS. 3a and 3b are respectively a side sectional view and a plane view of another conventional one-chip type TCXO.
Figure 3B:
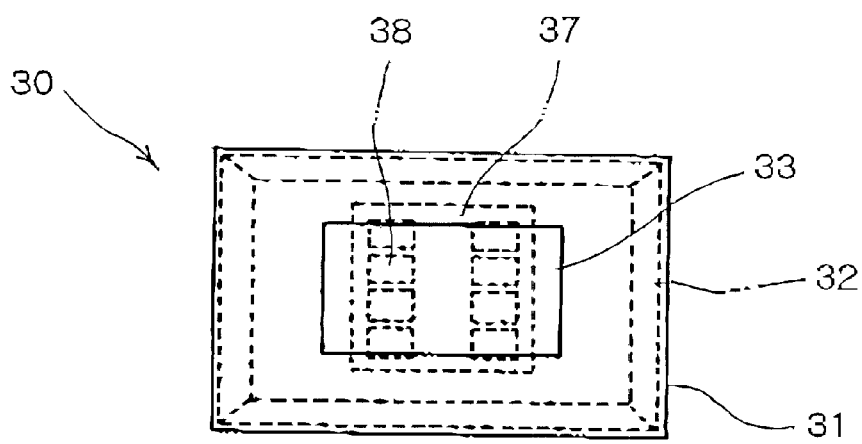

As described above, the present invention is basically characterized in that cavities provided as regions for mounting an IC chip 47 and a crystal vibrating chip 43 are formed not to be vertically overlapped with each other, such that an additional layer (represented with reference numeral 31c of FIG. 3) to be formed between the IC chip 47 and the crystal vibrating chip 43 can be removed, thus reducing the height of a final product, In the preferred embodiment of this invention, the reason that the first layered structure 41 employs two layers is to generally form a cavity through the two layers 41a and 41b so as to provide sufficient mounting height with respect to the height of IC chip 47. On the other hand, the reason that the second layered structure 42 employs two layers is to ensure the stepped structure of the cavity suitable for mounting the crystal vibrating chip 43 while having air gaps in the upper and lower portions of the cavity such that the crystal vibrating chip 43 oscillates according to an input signal. According to another preferred embodiment, in the case of the first layered structure 41, a cavity having a height suitable for mounting the IC chip can be formed only using a single layer with a sufficient height. On the other hand, in the case of the second layered structure 42, a cavity can be formed to have one of structures suitable for other typical mounting methods as will be described later in FIG. 5.

If the structure of the temperature compensated crystal oscillator 40 of this invention is differently expressed, it can be described that the lower surface of the second layered structure 42 forms the upper surface of the cavity of first layered structure 41, and the upper surface of the first layered structure 41 forms the lower surface of the cavity of the second layered structure 42.

Furthermore, the cavity formed in the first layered structure 41 to mount the IC chip 47 has conduction pads 48 for flip chip bonding on the lower surface of the second layered structure 42, which forms the upper surface of the cavity of the first layered structure 41. At this time, the IC chip 47 can be easily mounted using the flip chip bonding method. Moreover, the cavity in which the IC chip 47 is inserted is charged with resin mold, such that a mold portion 49 having a bottom surface level with the lower surface of the first layered structure 41 is formed to keep the cavity airtight. Then, a metal cover 45 is adhered to the upper surface of the second layered structure 42, such that the opening of the cavity formed in the second layered structure 42 is covered, thus completing the final product.

FIG. 4b is the plane view of the temperature compensated crystal oscillator 40 of this invention. The crystal vibrating chip 43 is inserted into the cavity formed in the second layered structure 42 which is an upper layered structure, and the IC chip 47 is inserted into the cavity formed in the first layered structure 41 which is a lower layered structure. Referring to the plane view of FIG. 4b, the cavities of the two layered structures are arranged in parallel with each other.

Generally, the IC chip 47 occupies an area considerably smaller than the crystal vibrating chip 43. For example, the size of the IC chip 47 is approximately 1.84×1.38 mm, while the size of the crystal vibrating chip 43 is approximately 3.6×1.89 mm or 3.6×1.72 mm. There ore, although the cavity for mounting the IC chip 47 is formed not to be vertically overlapped with the cavity for mounting the crystal vibrating chip 43, the area of the product is not increased a lot. Further, as shown in FIG. 4b, the IC ship 47 is arranged such that its long side (b) is practically parallel with a long side (c) of the rectangular crystal vibrating chip 43, thus somewhat reducing the increase of a width due to the side arrangement of the IC chip 47. En this case, the arrangement relation of the IC chip 47 and the crystal vibrating chip 43 proposed here is only a preferable example of the present invention, and the present invention is not limited to this arrangement relation. Alternately, the crystal vibrating chip 43 is arranged in the same direction as the crystal vibrating chip 33 of FIG. 3b, and the IC chip 47 is arranged beside a short side of the rectangular crystal vibrating chip 43.

As described above, although the structure of the crystal oscillator of this invention is accompanied with the increase of the product area, it is acceptable for application to a slim mobile communication terminal (that is, less than approximately 2 mm which is somewhat larger than the length of the short side of the IC chip). In this field, it is strongly required to reduce the height of the product even if the area of the product is somewhat increased.

The structure of the present invention for satisfying the requirement of reduced height can remove an additional layer which is recognized as an essential element in the conventional temperature compensated crystal oscillator and is used to separate the two cavity areas. As described above, if the height of a layer employed in conventional crystal oscillator is approximately 0.15 to 2.0 mm, the crystal oscillator of this invention can reduce the total height (for example, approximately 1.2 to 1.5 mm) of the product by about 15 to 20% by removing the additional layer. This reduction of height is sufficient enough to make the design of boards more flexible, considering that the standard specification of the height of the crystal oscillator is 1.5 mm, and satisfy the conditions as parts of a slim mobile communication terminal, which is the recent trend.

FIG. 4c is a side sectional view of the crystal oscillator of FIG. 4b viewed in a direction of A, and shows the mounting state of the crystal vibrating chip 43, which is adopted in the preferred embodiment. As shown in FIG. 4c, the second layered structure 42 is comprised of the layer 42a and the layer 42b placed on the upper surface of the layer 42a. In this case, the cavity formed in the upper layer 42b of the second layered structure 42 is constructed to have an opening larger than at least the area of the crystal vibrating chip 43 so as to contain the crystal vibrating chip 43. Further, the cavity formed in the lower layer 42a of the second layered structure 42 is constructed to have an opening smaller than at least the crystal vibrating chip 43, Moreover, the cavities formed in the two layers 42a and 42b are integrated to have a stepped structure.

The crystal vibrating chip 43 can be easily mounted using the cavity having the stepped structure. That is, as shown in a connection portion represented with "a" of FIG. 4c, one end of the crystal vibrating chip 43 is connected to be mechanically fixed to the upper portion of the side wall provided by the lower layer 42a. In addition, the crystal vibrating chip 43 can be electrically connected to the IC chip 47 and etc. through a signal path formed with conduction patterns and conduction via holds (not shown) at the upper portion of the side wall.

Figure 5:
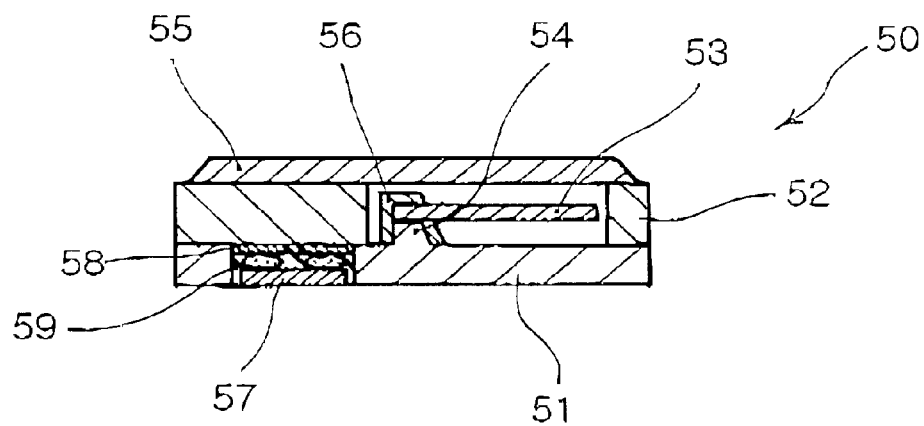
FIG. 5 is a side sectional view of another TCXO according to another preferred embodiment of this invention.

FIG. 5 is a side sectional view of another TCXO 50 according to another preferred embodiment of this invention. In this preferred embodiment, first and second layered structures 51 and 52 are each comprised of a single layer, wherein bottom of the cavity formed in the second layered structure 52 is provided by the upper surface of the first layered structure 51. A connection bump 54 is formed on the upper surface of the first layered structure 51, and a crystal vibrating chip 53 is arranged on the connection bump 54 and fixed by the adhesive material 56, such that the crystal vibrating chip 53 can be mounted. The IC chip 57 is connected to connection pads 58 provided on the lower surface of the second layered structure 52 using a flip chip bonding method in the same as that of FIG. 4, and then a resin mold portion 59 is formed to package the IC chip 57. In this embodiment, the present invention provides a mounting area having a depth sufficient to mount the IC chip 57, using a single layer 51 of a suitable thickness.

In the preferred embodiment of this invention, two cavities respectively formed in the first and second layered structures 51 and 52 are also constructed not to be overlapped vertically. Here, the upper surface of the cavity formed in the first layered structure 51 is covered with the lower surface of the second layered structure 52, while the cavity formed in the second layered structure 52 is covered with the upper surface of the first layered structure 51.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. For example, although first and second layered structures are each comprised of more than three or four layered, if the temperature compensated crystal oscillator has the structure in which two cavities provided as the mounting areas are not vertically overlapped and an additional layer for separating the two cavities is removed, the temperature compensated crystal oscillator can be also included in the present invention.

As described above, the present invention provides a temperature compensated crystal oscillator, in which two cavities for accommodating a crystal vibrating chip and an IC chip are each open at its top and bottom, and arranged not to be vertically overlapped so as to remove a layer for separating the crystal vibrating chip and the IC chip, thereby reducing the height of a final product.

What is claimed is:

1. A temperature compensated crystal oscillator, comprising:
    a first layered structure comprising at least one layer and being provided with a cavity formed therein;
    a second layered structure arranged on an upper surface of the first layered structure, said second layered structure comprising at least one layer and being provided with a cavity formed in a region that does not overlap the cavity of the first layered structure;
    an IC chip received in the cavity of the first layered structure;
    a crystal vibrating chip received in the cavity of the second layered structure;
    a mold portion made of resin received in the cavity of the first layered structure that accommodates the IC chip, said mold portion having a bottom surface flush with a bottom surface of the first layered structure; and
    a sealing cover arranged on an upper surface of the second layered structure and covering the cavity formed in the second layered structure;
    wherein the first layered structure comprises two layers, and the cavity of the first layered structure is an integrated cavity formed through the two layers.

2. The temperature compensated crystal oscillator according to claim 1 wherein
    the second layered structure comprises a first layer and a second layer placed on an upper surface of the first layer;
    a cavity is formed in the second layer and has an opening larger than at least the crystal vibrating chip;
    a cavity is formed in the first layer and has an opening smaller than at least the crystal vibrating chip; and
    the cavities formed in the first and second layers are integrated to form a the cavity of the second layered structure, said cavity of the second layered structure having a stepped structure.

3. The temperature compensated crystal oscillator according to claim 2, wherein the crystal vibrating chip has one end thereof connected to an upper portion of a side wall of the cavity formed in the first layer.

4. The temperature compensated crystal oscillator according to claim 1, wherein
    the cavity formed in the second layered structure has a bottom surface formed by a portion of the upper surface of the first layered structure;
    a connection bump is formed at said portion; and
    the crystal vibrating chip is received in the cavity formed in the second layered structure, so that one end of the crystal vibrating chip is supported by the connection bump.

5. The temperature compensated crystal oscillator according to claim 1, wherein the cavity formed in the second layered structure has rectangular openings.

6. The temperature compensated crystal oscillator according to claim 1, wherein
    the cavity formed in the first layered structure has a top surface formed by a portion of a lower surface of the second layered structure;
    connection pads are arranged at said portion of the lower surface of the second layered structure; and
    the IC chip is received in the cavity formed in the first layered structure to be connected to the connection pads in a flip chip bonding manner.

7. A temperature compensated crystal oscillator, comprising:
    a first layered structure comprising two layers and having a cavity extending through said two layers;
    a second layered structure arranged on an upper surface of the first layered structure and having a cavity that does not overlap the cavity of the first layered structure;
    an IC chip received in the cavity of the first layered structure;
    a crystal vibrating chip received in the cavity of the second layered structure;
    a resin filled in the cavity of the first layered structure below the IC chip; and
    a sealing cover arranged on an upper surface of the second layered structure and covering an opening of the cavity formed in the second layered structure.

8. The temperature compensated crystal oscillator according to claim 7, wherein the second layered structure comprises a first layer and a second layer placed on an upper surface of the first layer;

said cavity of the second layered structure has a stepped structure defined by first and second cavity sections formed in the first and second layers, respectively;

the first cavity section is formed in the first layer and has an opening smaller than at least the crystal vibrating chip; and the second cavity section is formed in the second layer and has an opening larger than at least the crystal vibrating chip.

9. The temperature compensated crystal oscillator according to claim 8, wherein the crystal vibrating chip has one end thereof attached to an upper portion of a side wall of the first cavity section formed in the first layer.

10. The temperature compensated crystal oscillator according to claim 7, wherein the cavity formed in the second layered structure has a bottom surface defined by a portion of the upper surface of the first layered structure;

a connection bump is formed at said portion; and the crystal vibrating chip is received in the cavity formed in the second layered structure, so that one end of the crystal vibrating chip is supported by the connection bump.

11. The temperature compensated crystal oscillator according to claim 7, wherein the opening of the cavity formed in the second layered structure is rectangular.

12. The temperature compensated crystal oscillator according to claim 7, wherein the cavity formed in the first layered structure has a top wall defined by a portion of a lower surface of the second layered structure;

connection pads are arranged at said portion of the lower surface of the second layered structure; and the IC chip is received in the cavity formed in the first layered structure to be attached to the connection pads in a flip chip bonding manner.

* * * * *